(12) United States Patent
Oku et al.

(10) Patent No.: US 12,001,136 B2
(45) Date of Patent: Jun. 4, 2024

(54) PELLICLE INTERMEDIARY BODY, PELLICLE, METHOD FOR MANUFACTURING OF PELLICLE INTERMEDIARY BODY, AND PELLICLE MANUFACTURING METHOD

(71) Applicant: AIR WATER INC., Osaka (JP)

(72) Inventors: Hidehiko Oku, Azumino (JP); Kei Mihara, Azumino (JP); Ichiro Hide, Azumino (JP)

(73) Assignee: Air Water Inc., Osaka (JP)

( * ) Notice: Subject to any disclaimer, the term of this patent is extended or adjusted under 35 U.S.C. 154(b) by 466 days.

(21) Appl. No.: 17/432,852

(22) PCT Filed: Feb. 21, 2020

(86) PCT No.: PCT/JP2020/007003
§ 371 (c)(1),
(2) Date: Aug. 20, 2021

(87) PCT Pub. No.: WO2020/175355
PCT Pub. Date: Sep. 3, 2020

(65) Prior Publication Data
US 2022/0171279 A1 Jun. 2, 2022

(30) Foreign Application Priority Data
Feb. 25, 2019 (JP) .................. 2019-031707

(51) Int. Cl.
*G03F 1/64* (2012.01)
*G03F 1/62* (2012.01)

(52) U.S. Cl.
CPC . *G03F 1/64* (2013.01); *G03F 1/62* (2013.01)

(58) Field of Classification Search
CPC ..................................... G03F 1/62; G03F 1/64
USPC ........................................................... 430/5
See application file for complete search history.

(56) References Cited

U.S. PATENT DOCUMENTS

| | | | | |
|---|---|---|---|---|
| 7,901,846 B2 * | 3/2011 | Kubota | ................... | B82Y 10/00 430/5 |
| 9,195,130 B2 * | 11/2015 | Yamada | ..................... | G03F 1/62 |
| 9,405,184 B2 * | 8/2016 | Yamada | ..................... | G03F 1/62 |

| | | | |
|---|---|---|---|
| 2003/0020096 A1 | 1/2003 | Akiyama et al. | |
| 2003/0170999 A1 | 9/2003 | Sakaguchi et al. | |
| 2009/0104544 A1 | 4/2009 | Kubota et al. | |
| 2012/0045714 A1 | 2/2012 | Akiyama et al. | |

FOREIGN PATENT DOCUMENTS

| | | |
|---|---|---|
| CN | 1241803 A | 1/2000 |
| CN | 102405440 A | 4/2012 |
| CN | 106 920 745 A | 7/2017 |
| EP | 0 961 312 A1 | 12/1999 |
| JP | 2000-036583 A | 2/2000 |
| JP | 2000-049063 A | 2/2000 |
| JP | 2001-144275 A | 5/2001 |
| JP | 2009-116284 A | 5/2009 |
| JP | 2010-045272 A | 2/2010 |
| JP | 2010-256434 A | 11/2010 |
| JP | 2018-115094 A | 7/2018 |
| TW | 468278 B | 12/2001 |
| TW | 201218312 A | 5/2012 |
| WO | 2014-188710 A1 | 2/2017 |
| WO | 2019/031361 A1 | 2/2019 |

OTHER PUBLICATIONS

Supplementary European Search Report, dated Feb. 25, 2022, in European Patent Application No. EP 20 76 2719.
Office Action dated Aug. 2, 2023 in Israel Application No. 285859.
International Preliminary Report on Patentability and Written Opinion of the International Searching Authority, issued Aug. 25, 2021 in International Application No. PCT/JP2020/007003.
International Search Report, dated Apr. 7, 2020 in International Patent Application No. PCT/JP2020/007003.
Office Action dated Mar. 14, 2023, in Taiwan Patent Application No. 109105961.
Office Action dated Mar. 14, 2023, in Japanese Patent Application No. 2019-031707.
Written Opinion dated Mar. 24, 2023 in Singapore Patent Application No. 11202109296W.

\* cited by examiner

*Primary Examiner* — Christopher G Young
(74) *Attorney, Agent, or Firm* — Wood, Phillips, Katz, Clark & Mortimer

(57) ABSTRACT

A pellicle intermediary body, a pellicle, a method for manufacturing a pellicle intermediary body, and a pellicle manufacturing method are provided. A pellicle intermediary body has a Si substrate, a Si oxide film formed on a surface of the Si substrate, and a Si layer formed on a surface of the Si oxide film. The Si layer includes a low COP (Crystal Originated Particle) portion which is a part where the number of COPs decreases as it approaches the surface of the Si layer and is formed in the part that constitutes the surface of the Si layer.

8 Claims, 28 Drawing Sheets

(a)

(b)

(c)

PELLICLE INTERMEDIARY BODY, PELLICLE, METHOD FOR MANUFACTURING OF PELLICLE INTERMEDIARY BODY, AND PELLICLE MANUFACTURING METHOD

BACKGROUND OF THE INVENTION

Field of the Invention

This invention relates to a pellicle intermediary body, a pellicle, a method for manufacturing of a pellicle intermediary body, and a pellicle manufacturing method. More specifically, this invention relates to a pellicle intermediary body, a pellicle, a method for manufacturing of a pellicle intermediary body, and a pellicle manufacturing method which improve the quality of the pellicle film.

Background Art

According to photolithographic technologies used in a manufacturing process of semiconductor devices, resist is applied to a semiconductor wafer, and the required part of the applied resist is irradiated with exposure light with a photo mask. As a result, a resist pattern of a required shape is created on the semiconductor wafer.

According to manufacturing processes of semiconductor devices, the demand for miniaturization of photolithography technology is increasing with miniaturization of semiconductor devices. In recent years, EUV (Extreme Ultra Violet) light (wavelength: 13.5 nanometers) and the like, which has shorter wavelength than conventional light (wavelength: 248 nanometers) from a light source of KrF (Krypton Fluoride) excimer laser and conventional light (wavelength: 193 nanometers) from a light source of ArF (Argon Fluoride) excimer laser, are being considered as exposure light used.

In a photolithography technology, when irradiating the resist with exposure light, foreign matter is prevented from adhering to a photo mask by covering the photo mask with a dust-proof cover called a pellicle. As a pellicle film for a pellicle, a material having high transmission of exposure light and high resistance to exposure light (with less deterioration or deformation at a high temperature) is suitable. As pellicle films, organic thin films were used until the ArF generation. However, in the EUV generation, using pellicle films consisting of Si (silicon), SiN (silicon nitride), C (graphite, graphene, DLC (diamond-like carbon), amorphous carbon, or the like), SiC (silicon carbide), etc. as the materials with higher transmittance and resistance is being considered.

As a technology related to a manufacturing method for a pellicle including a pellicle film consisting of Si, a pellicle manufacturing method is disclosed in the following Patent Document 1. In this Document, a ring-like pellicle frame made of a Si crystal film is adhered to a SOI (Silicon On Insulator) substrate. By removing the Si film and the Si oxide film on the SOI substrate, a pellicle film made of Si is produced.

Since the energy of light increases in inverse proportion to the wavelength, the energy that a pellicle film receives from the exposure light increases as the wavelength of the exposure light becomes shorter. For this reason, with the wavelength of the exposure light being shorter, pellicle films are required to have higher resistance to exposure light. As such a material for the pellicle films, SiC, which is thermally and chemically stable, is more preferable than Si.

As a technology related to a manufacturing method for a pellicle including a pellicle film consisting of SiC, a manufacturing method is disclosed in the following Patent Document 2. In this Document, a polycrystal SiC film is formed on a silicon wafer by LPCVD (Low Pressure Chemical Vapor Deposition) method. The polycrystal SiC film is polished to a thickness of 150 nanometers by the CMP (Chemical Mechanical Polishing) method. The silicon wafer is wet etched with an aqueous solution of KOH (potassium hydroxide).

The technology of the following Patent Document 2 has a problem in which the pellicle film is easily damaged when the silicon wafer is wet-etched. A technique capable of solving this problem is disclosed in Patent Document 3 below. Patent Document 3 below discloses a method for manufacturing. According to this method, a pellicle film consisting of SiC is formed with a SOI substrate as a foundation. By removing the central part of the SOI substrate, the reverse side of the pellicle film is exposed at the bottom of the recessed part. According to the technology of Patent Document 3 below, by interposing a Si oxide film between the Si substrate and the pellicle film, the tension stress inside the pellicle film can be alleviated, and damage to the pellicle film during manufacturing can be suppressed.

[Patent Document1] Japanese published unexamined application No. 2009-116284

[Patent Document2] International publication No. 2014/188710 pamphlet

[Patent Document3] Japanese published unexamined application No. 2018-115094

The technologies of Patent Documents 2 and 3 had a problem of poor quality of the pellicle film.

SUMMARY OF THE INVENTION

The present invention is to solve the above problem. The object is to provide a pellicle intermediary body, a pellicle, a method for manufacturing a pellicle intermediary body, and a pellicle manufacturing method which can improve the quality of the pellicle film.

According to one aspect of the present invention, a pellicle intermediary body comprises: a Si substrate, a Si oxide film formed on a surface of the Si substrate, and a Si layer formed on a surface of the Si oxide film, wherein the Si layer includes a low COP (Crystal Originated Particle) portion which is a part where the number of COPs decreases as it approaches the surface of the Si layer and is formed in a part constituting the surface of the Si layer.

According to another aspect of the present invention, a pellicle comprises: a Si substrate with a ring-like planar shape, a Si oxide film which has a ring-like planar shape, formed on a surface of the Si substrate, a Si layer which has a ring-like planar shape, formed on a surface of the Si oxide film, and a SiC film formed on a surface of the Si layer, wherein the Si layer includes a low COP (Crystal Originated Particle) portion which is a part where the number of COPs decreases as it approaches the surface of the Si layer and is formed in a part constituting the surface of the Si layer.

According to another aspect of the present invention, a method for manufacturing a pellicle intermediary body comprises steps of: preparing a Si layer which includes a low COP (Crystal Originated Particle) portion which is a part where the number of COPs decreases as it approaches a surface and is formed in a part constituting the surface, preparing a first oxide film substrate including a first Si substrate, and a first Si oxide film formed on a surface of the first Si substrate, preparing a second oxide film substrate including a second Si substrate, a second Si oxide film formed on a surface of the second Si substrate, joining the first Si oxide film to the surface of the Si layer, removing a part that constitutes a reverse side of the Si layer after joining the first Si oxide film, joining the second Si oxide film to the reverse side of the Si layer after the part constituting the reverse side of the Si layer is removed, exposing the first Si oxide film by wet etching the first Si substrate under a condition that an etching rate of Si is faster than an etching rate of Si oxide after joining the second Si oxide film, and exposing the surface of the Si layer by removing the first Si oxide film after exposing the first Si oxide film.

Preferably, according to the method for manufacturing, the first oxide film substrate containing the first Si substrate and the first Si oxide film formed on the surface and the reverse side of the first Si substrate is prepared, in the step in which the first oxide film substrate is prepared, and the method further comprises a step of exposing the reverse side of the first Si substrate by removing a portion formed on the reverse side of the first Si substrate in the first Si oxide film, after joining the first Si oxide film.

Preferably, according to the method for manufacturing, the second oxide film substrate containing the second Si substrate and the second Si oxide film formed on the surface and the reverse side of the second Si substrate is prepared, in the step in which the second oxide film substrate is prepared, and the method further comprises a step of exposing the reverse side of the second Si substrate by removing a portion formed on the reverse side of the second Si substrate in the second Si oxide film, after joining the second Si oxide film.

According to another aspect of the present invention, a method for manufacturing a pellicle comprises steps of: producing a pellicle intermediary body using the above method, forming a SiC film on a surface of the Si layer, forming a recessed part on the second Si substrate and exposing the second Si oxide film on a bottom of the recessed part, by wet etching the second Si substrate under a condition that an etching rate of Si is faster than an etching rate of Si oxide, and exposing the SiC film on the bottom of the recessed part by wet etching the second Si oxide film and the Si layer that are present at the bottom of the recessed part.

Preferably, according to the method for manufacturing, the method further comprises a step of: forming the recessed part on the second Si substrate by mechanically grinding the second Si substrate, after the step that manufactures the pellicle film intermediary body and before the step that exposes the second Si oxide film, wherein the second Si oxide film is exposed at the bottom of the recessed part by wet etching the second Si substrate existing at the bottom of the recessed part at the step that exposes the second Si oxide film.

Preferably, according to the method for manufacturing, the step that exposes the SiC film at the bottom of the recessed part includes a step that exposes the Si layer at the bottom of the recessed part by wet etching the second Si oxide film existing at the bottom of the recessed part, and a step that exposes the SiC film at the bottom of the recessed part by wet etching the Si layer existing at the bottom of the recessed part, wherein the Si layer is moved relative to liquid chemical used for wet etching of the Si layer at the step that exposes the SiC film.

According to the present invention, a pellicle intermediary body, a pellicle, a method for manufacturing a pellicle intermediary body, and a pellicle manufacturing method being capable of improving the quality of the pellicle film can be provided.

DETAILED DESCRIPTION OF THE PREFERRED EMBODIMENTS

Hereinafter, an embodiment of the present invention will be described with reference to the drawings.

Figure 1:
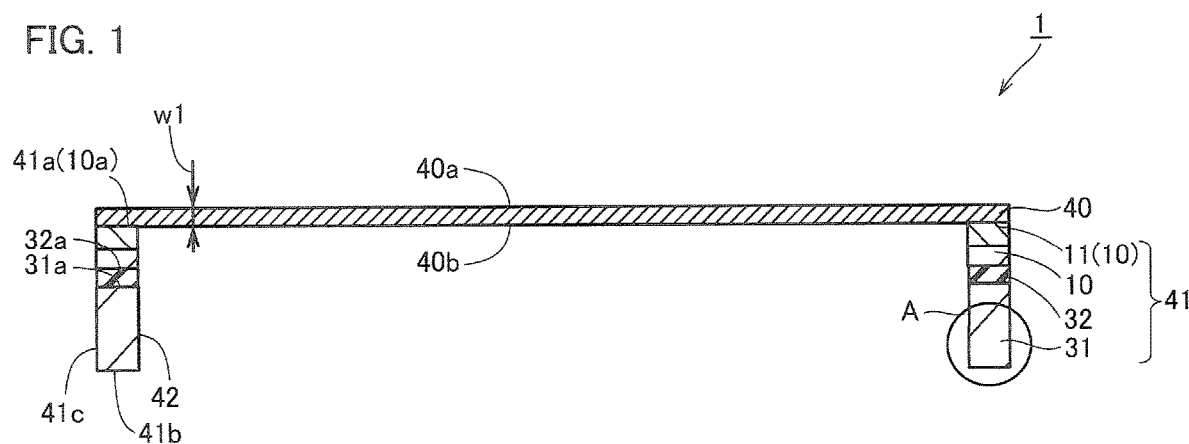
FIG. 1 is a cross-sectional view showing the configuration of pellicle 1 in one embodiment of the present invention.

FIG. 1 is a cross-sectional view showing the configuration of pellicle 1 in one embodiment of the present invention. FIG. 1 shows the cross-sectional view when cut with a plane perpendicular to surface 40a of SiC film 40.

Referring to FIG. 1, pellicle 1 in this embodiment (an example of a pellicle) is a SiC self-standing substrate where a pellicle film consisting of SiC is partially supported by a supporting substrate, and comprises supporting substrate 41 and SiC film 40 as a pellicle film (an example of a SiC film).

Supporting substrate 41 includes Si substrate 31 (an example of a Si substrate), Si oxide film 32 (an example of a Si oxide film), and Si layer 10 (an example of a Si layer). When viewed from a direction perpendicular to surface 40a of SiC film 40, each of Si substrate 31, Si oxide film 32, and Si layer 10 has a ring-like planar shape.

Si oxide film 32 is formed on surface 31a of Si substrate 31. Si layer 10 is formed on surface 32a of Si oxide film 32. The (111) plane is exposed on surface 10a of Si layer 10. The (100) surface or the (110) surface may be exposed on the surface 10a of the Si layer 10. Si layer 10 includes low COP portion 11 (an example of a low COP portion) formed in the part constituting surface 10a of Si layer 10. The low COP portion is the portion where the number of COPs is smaller as it is closer to the surface of the Si layer.

SiC film 40 is formed on surface 10a of Si layer 10 (surface 41a of supporting substrate 41). SiC film 40 may not be formed on reverse side 41b and side surface 41c of supporting substrate 41. SiC film 40 may be formed on reverse side 41b and side surface 41c of supporting substrate 41. Since supporting substrate 41 is circular, recessed part 42 is formed in the central part of supporting substrate 41. The recessed part 42 is covered by SiC film 40, and reverse side 40b of SiC film 40 is exposed at the bottom of recessed part 42.

SiC film 40 has a thickness w1 of 10 nanometers or more and 160 nanometers or less. The thickness w1 is preferably 15 nanometers or more, and preferably 30 nanometers or less. SiC film 40 consists of single-crystal 3C-SiC, polycrystal 3C-SiC, amorphous SiC, or the like. When SiC film 40 is formed on a Si substrate, SiC film 40 generally consists of 3C-SiC.

Figure 2:
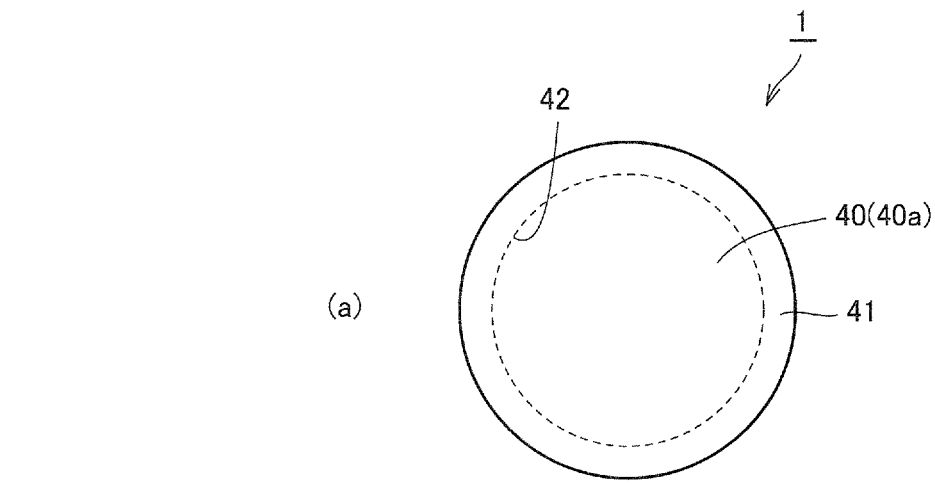
FIG. 2 is a plan view showing the configuration of pellicle 1 when viewed from a direction perpendicular to surface 40a of SiC film 40 in one embodiment of the present invention.
Figure 2:
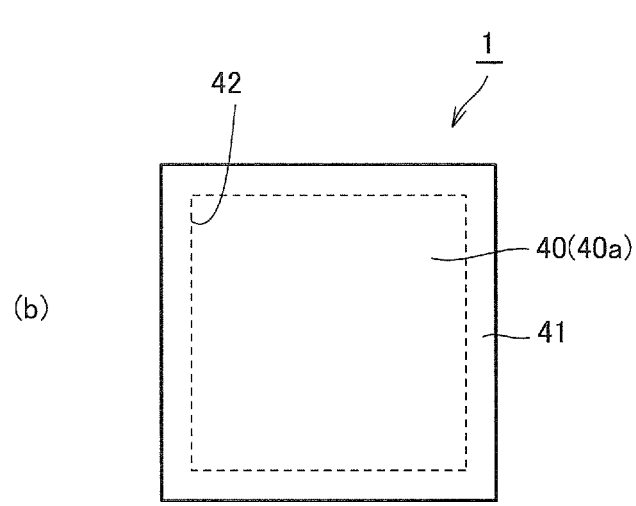
Figure 2:
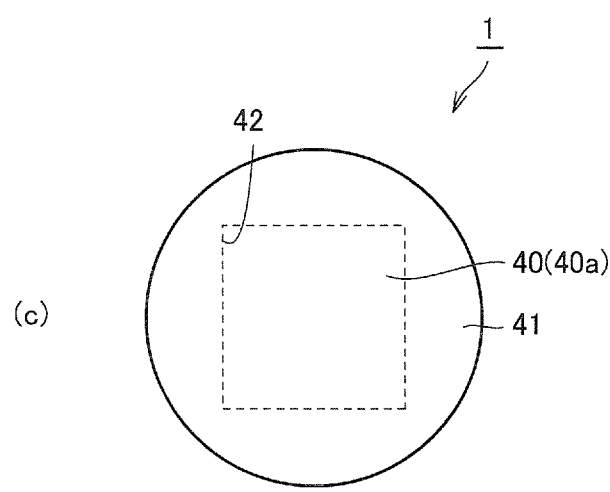

FIG. 2 is a plan view showing the configuration of pellicle 1 when viewed from a direction perpendicular to surface 40a of SiC film 40 in one embodiment of the present invention. In FIG. 2, supporting substrate 41 is shown by a dotted line for the purpose of showing the shape of supporting substrate 41, but in reality, supporting substrate 41 is not directly visible.

Referring to FIG. 2, each of SiC film 40, supporting substrate 41, and recessed part 42 have an arbitrary planar shape. SiC film 40 has its outer peripheral end supported by the ring-like supporting substrate 41. As a result, the mechanical strength of SiC film 40 is reinforced by supporting substrate 41. Each of SiC film 40, supporting substrate 41, and recessed part 42 may have a circular planar shape as shown in FIG. 2 (a), or it may have a rectangular planar shape as shown in FIG. 2 (b). In FIG. 2 (b), supporting substrate 41 has a square ring-like planar shape. Further, as shown in FIG. 2 (c), each of SiC film 40 and supporting substrate 41 has a circular planar shape, and recessed part 42 may have a rectangular planar shape. The size of recessed part 42 is arbitrary and may be determined according to the mechanical strength or the like required for pellicle 1.

Next, the method for manufacturing of pellicle 1 in the present embodiment will be described with reference to FIGS. 3 to 26.

Figure 3:
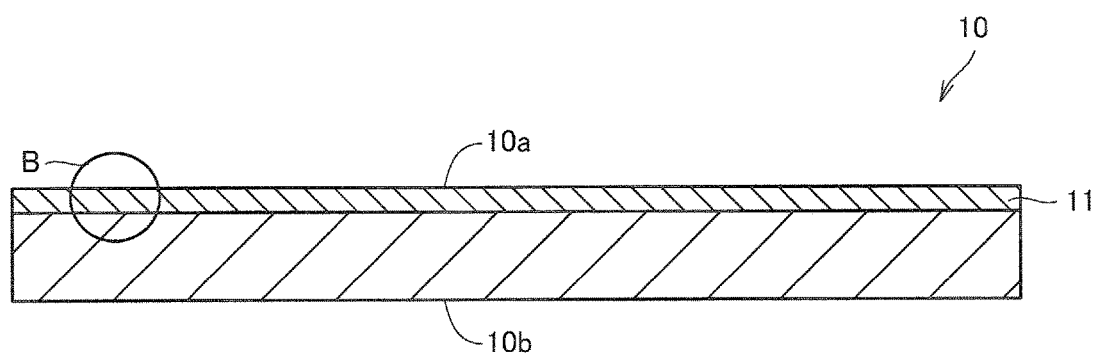
FIG. 3 is a cross-sectional view indicating the first step of the method for manufacturing of pellicle 1 in one embodiment of the present invention.

Referring to FIG. 3, disc-shaped Si substrate 10 is prepared, for example. Si substrate 10 includes surface 10a and reverse side 10b, both extending in a parallel direction. Si substrate 10 includes low COP portion 11 in the part constituting surface 10a of Si substrate 10. The COP is an octahedrally shaped hole having a size of 100 nanometers to 200 nanometers. COPs occur within the crystal during the crystal growth of the Si substrate.

Figure 4:
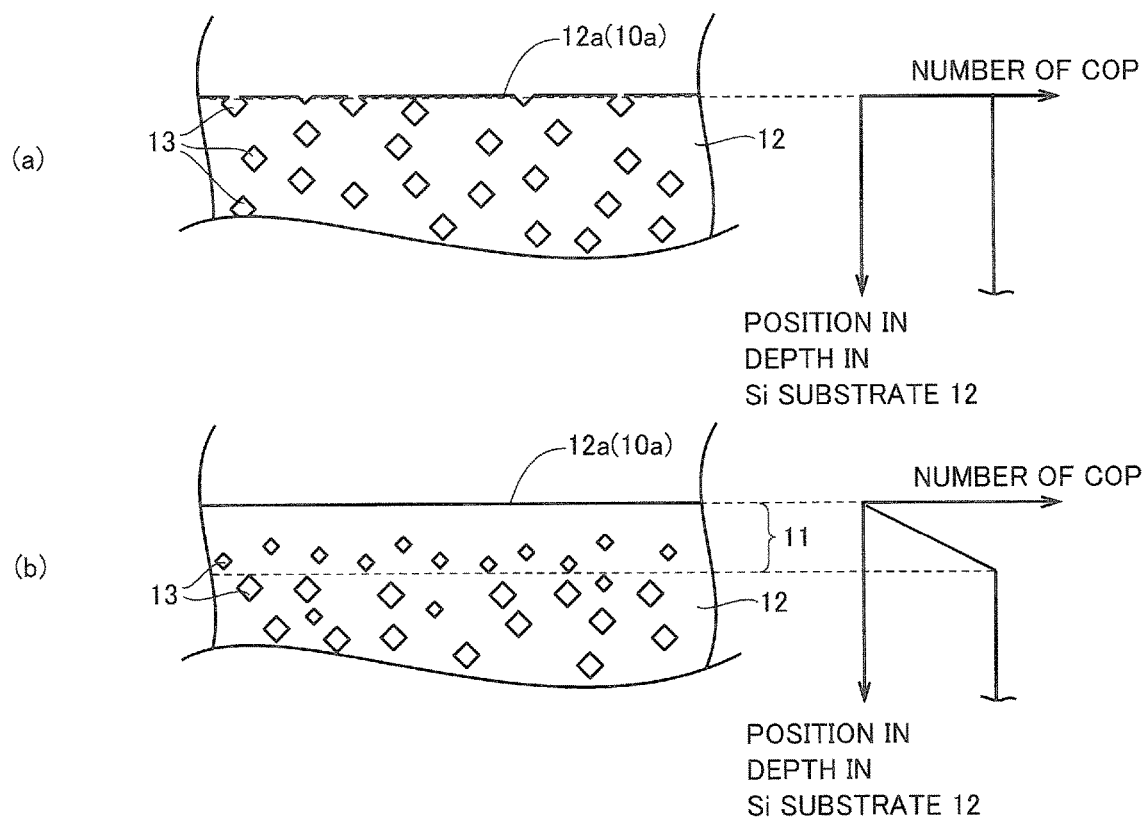
FIG. 4 is an enlarged view of part B in FIG. 3 before and after the annealing treatment.

FIG. 4 is an enlarged view of part B of FIG. 3 before and after the annealing treatment.

Referring to FIG. 4, Si substrate 10 is obtained by annealing Si substrate 12 not having a low COP portion in a low oxygen atmosphere such as an argon atmosphere or a hydrogen atmosphere at a temperature of 1100 degrees Celsius or more and 1300 degrees Celsius or less. A large number of COPs 13 are almost evenly dispersed in Si substrate 12 before the annealing treatment (FIG. 4 (a)). The average COP concentration within Si substrate 12 before annealing is, for example, $1*10^6$ pieces/cm$^3$.

When the above annealing treatment is performed, COPs 13 existing near surface 12a of Si substrate 12 (surface 10a of Si substrate 10) are released to the outside of Si substrate 12. The closer the COP 13 is to the surface 12a of the Si substrate 12, the easier it is to be released to the outside of the Si substrate 12. As a result, in the part of Si substrate 10 that constitutes surface 10a, low COP portion 11 occurs, which is a part where the number of COPs decreases toward surface 10a (FIG. 4 (b)). The COP concentration of surface 10a of Si substrate 10 after the annealing treatment is, for example, 0 to 1 piece/cm$^3$.

In addition, another low COP portion may be generated also in the portion constituting reverse side 10b of Si substrate 10 by the above annealing treatment. As a method for reducing the COPs in Si substrate 12, instead of the above annealing treatment, a method to control the crystal growth rate during the production of Si substrate 12 or a method for growing Si homo-epitaxially may be used.

Figure 5:
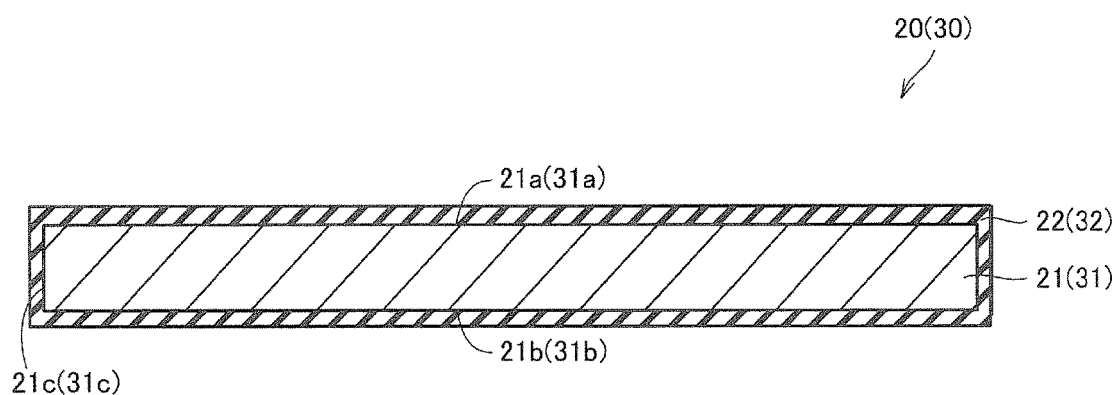
FIG. 5 is a cross-sectional view indicating the second step of the method for manufacturing of pellicle 1 in one embodiment of the present invention.

With reference to FIG. 5, oxide film substrate 20 (an example of a first oxide film substrate) is prepared. Oxide film substrate 20 includes Si substrate 21 (an example of a first Si substrate) and Si oxide film 22 (an example of a first Si oxide film). Si substrate 21 has the same planar shape as Si substrate 10. Si substrate 21 includes surface 21a and reverse side 21b extending in a parallel direction, and side surface 21c. Si oxide film 22 is formed on surface 21a, reverse side 21b, and side surface 21c of Si substrate 21, and covers the entire Si substrate 21. Oxide film substrate 20 is made by thermally oxidizing the entire Si substrate 21. The Si oxide film 22 formed on the surface 21a of the Si substrate 21 preferably has a thickness of 0.5 micrometers or more and 5 micrometers or less, and more preferably has a thickness of 2 micrometers.

Similarly, oxide film substrate 30 (an example of a second oxide film substrate) is prepared. The oxide film substrate 30 has the same configuration as the oxide film substrate 20, and includes the Si substrate 31 (an example of a second Si substrate) and Si oxide film 32 (an example of a second Si oxide film). Si substrate 31 has the same planar shape as Si substrate 10. Si substrate 31 includes surface 31a and reverse side 31b extending in a parallel direction, and side surface 31c. Si oxide film 32 is formed on surface 31a, reverse side 31b, and side surface 31c of Si substrate 31 and covers the entire Si substrate 31. The oxide film substrate 30 is made by thermal oxidation of the entire Si substrate 31. The Si oxide film 32 formed on the surface 31a of the Si substrate 31 preferably has a thickness of 0.5 micrometers or more and 5 micrometers or less, and more preferably has a thickness of 2 micrometers.

In oxide film substrates 20 and 30, the Si oxide film may be formed only on the surface of the Si substrate. The method for forming Si oxide films 22 and 32 is arbitrary and may be a method other than the thermal oxidation.

Figure 6:
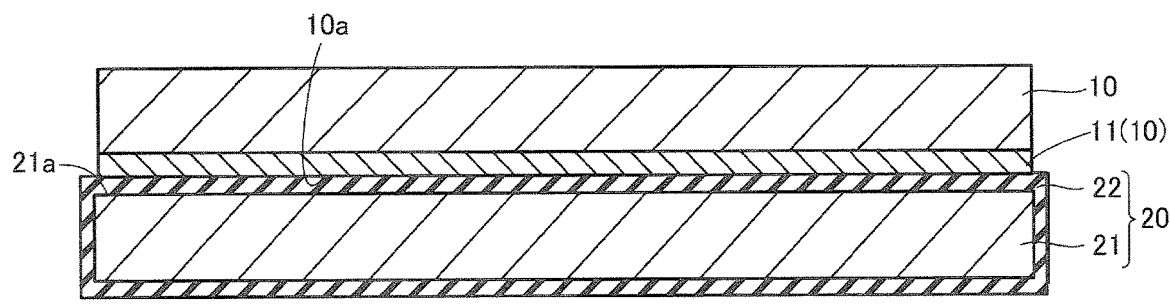
FIG. 6 is a cross-sectional view indicating the third step of the method for manufacturing of pellicle 1 in one embodiment of the present invention.

With reference to FIG. 6, the portion of Si oxide film 22 formed on surface 21a of Si substrate 21 is then joined to surface 10a of Si substrate 10. As a result, Si substrate 10 and oxide film substrate 20 are joined to each other. In the subsequent steps, Si substrate 10 becomes Si layer 10.

Figure 7:
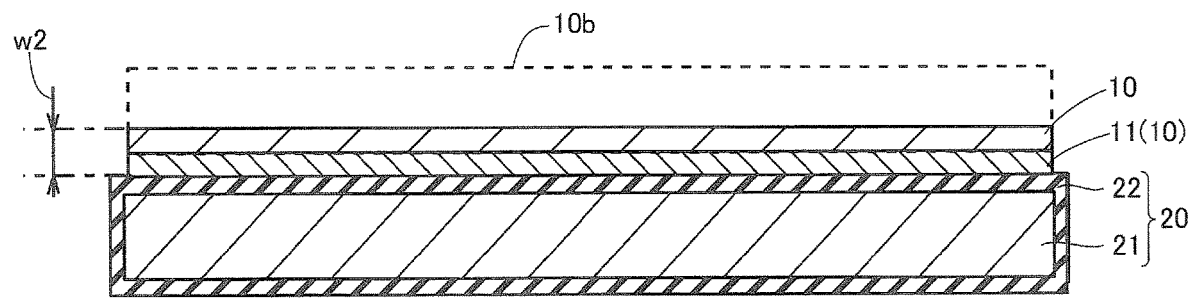
FIG. 7 is a cross-sectional view indicating the fourth step of the method for manufacturing of pellicle 1 in one embodiment of the present invention.

With reference to FIG. 7, after joining Si layer 10 and oxide film substrate 20, the Si of the part constituting reverse side 10b of Si layer 10 is ground. Low COP portion 11 is not removed and remains. The thickness w2 of Si layer 10 after grinding is preferably 20 micrometers or more and 100 micrometers or less, and more preferably 50 micrometers.

The method for removing Si of Si layer 10 is arbitrary, and may be a method such as dry etching or wet etching other than grinding.

Figure 8:
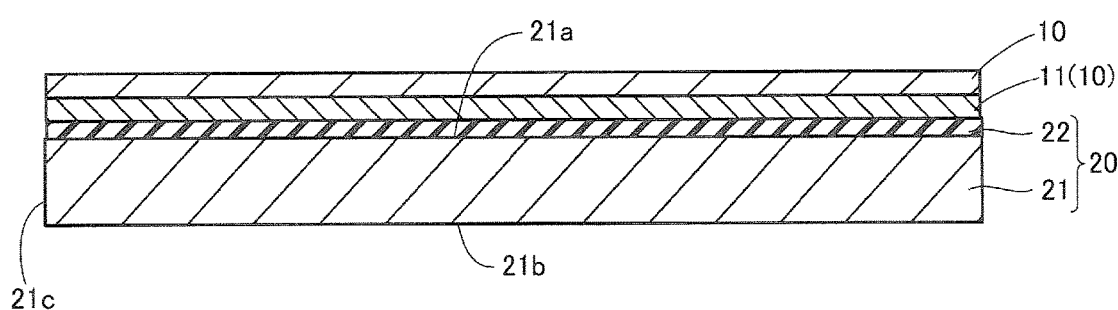
FIG. 8 is a cross-sectional view indicating the fifth step of the method for manufacturing of pellicle 1 in one embodiment of the present invention.

With reference to FIG. 8, after joining Si layer 10 and oxide film substrate 20, the portion of Si oxide film 22 formed on reverse side 21b and side surface 21c of Si substrate 21 is removed. As a result, reverse side 21b and side surface 21c of Si substrate 21 are exposed, and Si oxide film 22 remains only on surface 21a of Si substrate 21.

The method for removing Si oxide film 22 is arbitrary, and other than dry etching, a method such as wet etching or grinding may be adopted. If oxide film substrate 20 having Si oxide film 22 formed only on surface 21a of Si substrate 21 is prepared, the step shown in FIG. 8 may be omitted.

Figure 9:
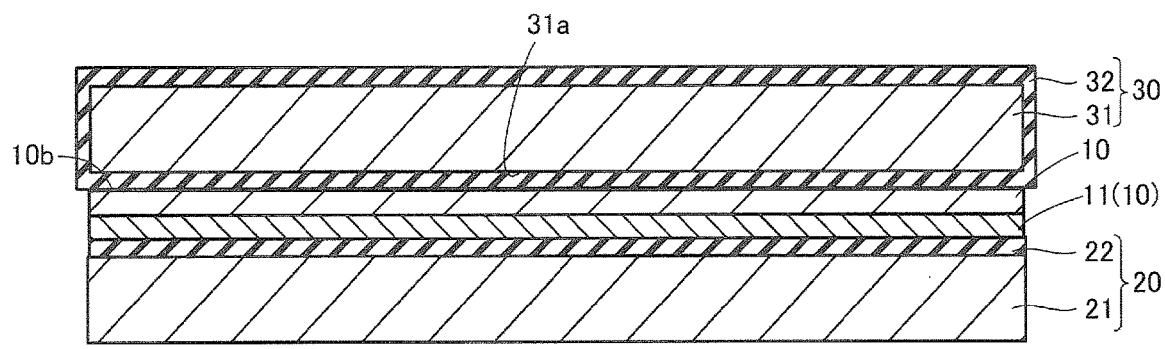
FIG. 9 is a cross-sectional view indicating the sixth step of the method for manufacturing of pellicle 1 in one embodiment of the present invention.

With reference to FIG. 9, after removing the Si of the part constituting reverse side 10b of Si layer 10, the part of Si oxide film 32, formed on surface 31a of Si substrate 31 is joined to reverse side 10b of Si layer 10. As a result, Si layer 10 and oxide film substrate 30 are joined.

Figure 10:
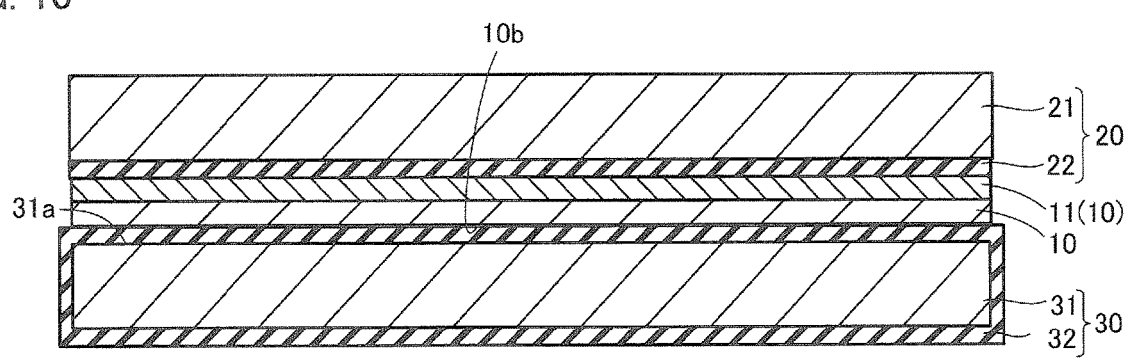
FIG. 10 is a cross-sectional view indicating the seventh step of the method for manufacturing of pellicle 1 in one embodiment of the present invention.

With reference to FIG. 10, after the Si layer 10 and the oxide film substrate 30 are joined, the resulting structure is flipped upside down.

Figure 11:
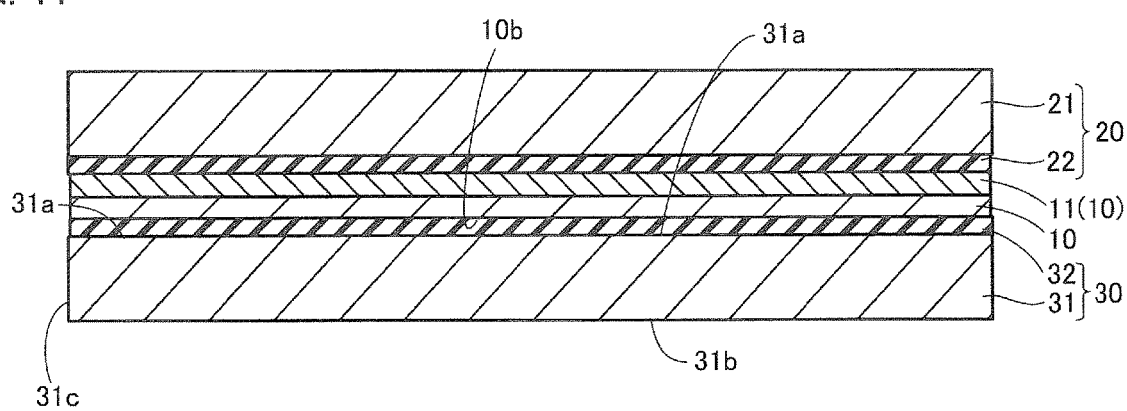
FIG. 11 is a cross-sectional view indicating the eighth step of the method for manufacturing of pellicle 1 in one embodiment of the present invention.

With reference to FIG. 11, after flipping upside down, the part of Si oxide film 32 formed on reverse side 31b and side surface 31c of Si substrate 31 is removed. As a result, Si oxide film 32 remains only on surface 31a of Si substrate 31.

The method for removing Si oxide film 32 is arbitrary, and other than dry etching, a method such as wet etching or grinding may be used. If oxide film substrate 30 having Si oxide film 32 formed only on surface 31a of Si substrate 31 is prepared, the step shown in FIG. 11 may be omitted.

Figure 12:
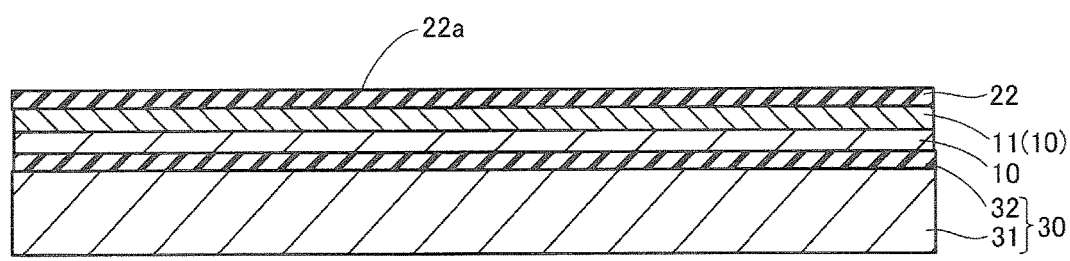
FIG. 12 is a cross-sectional view indicating the ninth step of the method for manufacturing of pellicle 1 in one embodiment of the present invention.

With reference to FIG. 12, after flipping upside down, Si substrate 21 is removed by wet etching. This exposes the surface 22a of Si oxide film 22. This wet etching is performed under the condition that the etching rate of Si is faster than the etching rate of Si oxide. During wet etching of Si substrate 21, Si oxide film 22 functions as an etching stopper, and the adverse effects caused by the variation in the etching rates of Si substrate 21 are mitigated by Si oxide film 22. This will be described later with reference to FIG. 20. Before the above-mentioned wet etching of Si substrate 21, a part of Si substrate 21 may be removed in advance by a method such as grinding.

The wet etching of Si substrate 21 is preferably performed by moving Si substrate 21 relative to liquid chemical used for wet etching. This will be described later with reference to FIGS. 21 to 23.

Figure 13:
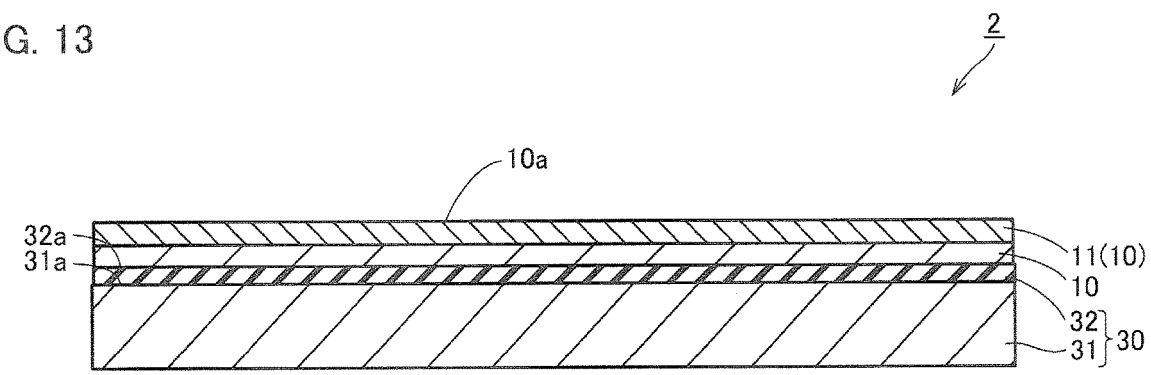
FIG. 13 is a cross-sectional view indicating the tenth step of the method for manufacturing of pellicle 1 in one embodiment of the present invention.

With reference to FIG. 13, after surface 22a of Si oxide film 22 was exposed, Si oxide film 22 is removed by wet etching. As a result, surface 10a of Si layer 10 is exposed, and pellicle intermediary body 2 (an example of a pellicle intermediary body) is obtained. When wet-etching Si oxide film 22, liquid chemical such as HF is used.

The method for removing Si oxide film 22 is preferably wet etching. However, other than wet etching, a method such as dry etching or grinding may be used.

The pellicle intermediary body 2 includes Si substrate 31, Si oxide film 32 formed on the surface 31a of the Si substrate 31, and Si layer 10 formed on the surface 32a of the Si oxide film 32. Si layer 10 contains low COP portion 11 formed in the part constituting surface 10a of Si layer 10.

Figure 14:
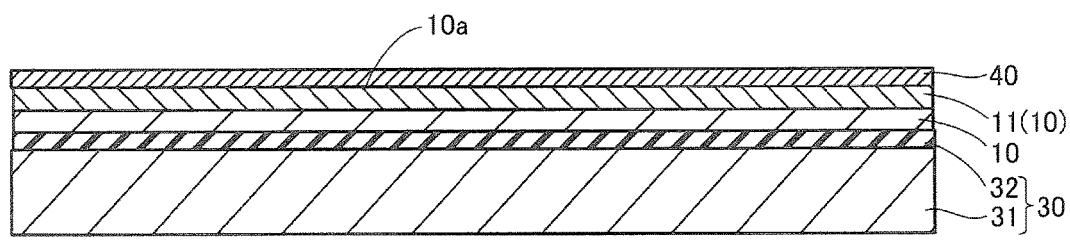
FIG. 14 is a cross-sectional view indicating the eleventh step of the method for manufacturing of pellicle 1 in one embodiment of the present invention.

With reference to FIG. 14, after obtaining pellicle intermediary body 2, SiC film 40 is formed on surface 10a (the surface of low COP portion 11) of Si layer 10. By setting the thickness of each of Si oxide film 32, Si layer 10, and SiC film 40 within the above range, the mechanical strength of SiC film 40 can be ensured, and it is possible to avoid the situation where cracks occur in SiC film 40, during the subsequent removal steps for each the layers shown in FIGS. 15, 19, 25, and 26.

For example, SiC film 40 is formed using the MBE (Molecular Beam Epitaxy) method, the CVD (Chemical Vapor Deposition) method, or the like on a foundation layer consisting of SiC obtained by carbonizing surface 10a of Si layer 10. SiC film 40 may be formed only by carbonizing the surface 10a of the Si layer 10. Further, SiC film 40 may be formed on surface 10a of Si layer 10 by using the MBE method, the CVD method, or the like. Since SiC film 40 is formed with low COP portion 11 as the foundation, the formed SiC film 40 has high quality.

Figure 15:
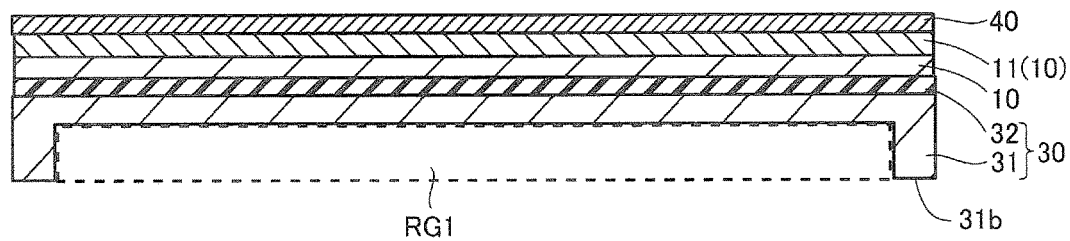
FIG. 15 is a cross-sectional view indicating the twelfth step of the method for manufacturing of pellicle 1 in one embodiment of the present invention.

With reference to FIG. 15, the Si of reverse side 31b in central part RG1 of Si substrate 31 is then removed (The reverse side 31b of Si substrate 31 is counterbored). Removal of the Si of central part RG1 may be done by mechanically grinding the Si of central part RG1 of Si substrate 31. The removal of Si of central part RG1 may be performed by etching the Si of central part RG1 with the formed photoresist as a mask, after photoresist is formed in the area other than central part RG1 on reverse side 31b of Si substrate 31.

In order to increase the resistance of the mask to liquid chemical used for wet etching of Si, the removal of Si of central part RG1 may be carried out by the following method.

Figure 16:
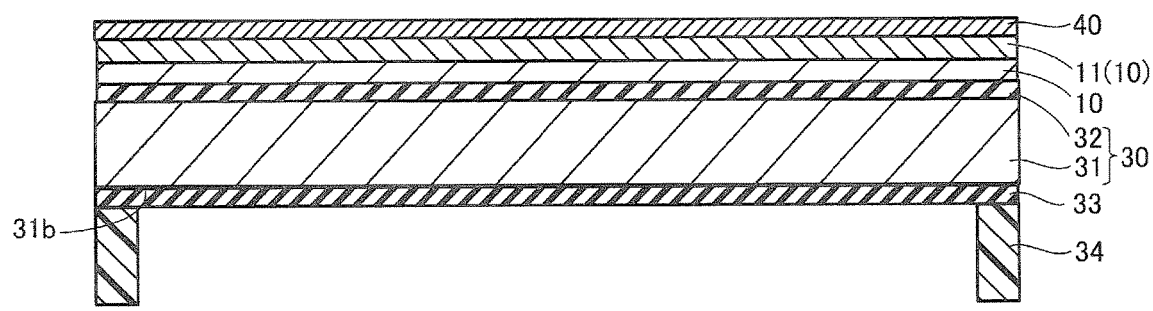
FIG. 16 is a cross-sectional view indicating the first step of a modification of the twelfth step of the method for manufacturing of pellicle 1 in one embodiment of the present invention.

With reference to FIG. 16, mask layer 33 composed of a Si oxide film or a Si nitride film is formed on the entire surface of reverse side 31b of Si substrate 31. Subsequently, photoresist 34, which was patterned in the required shape, is formed on mask layer 33.

Figure 17:
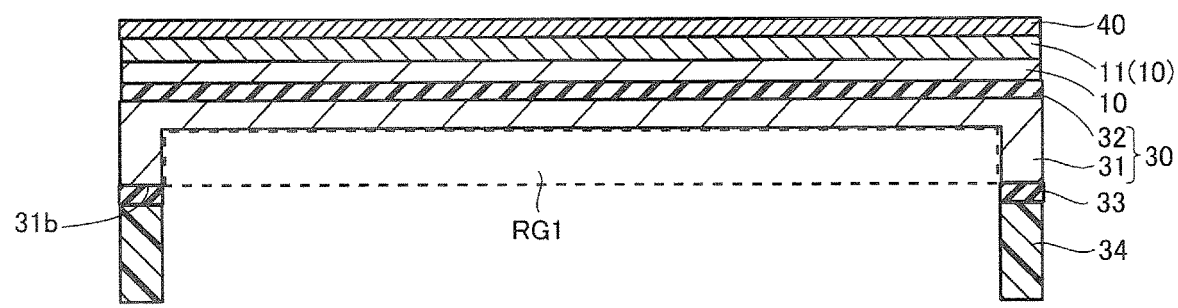
FIG. 17 is a cross-sectional view indicating the second step of a modification of the twelfth step of the method for manufacturing of pellicle 1 in one embodiment of the present invention.

With reference to FIG. 17, then mask layer 33 is patterned by wet etching with photoresist 34 as a mask. This leaves only the peripheral part of mask layer 33. When mask layer 33 consists of a Si oxide film, hydrofluoric acid solution or the like is used as liquid chemical for wet etching of mask layer 33. When mask layer 33 consists of a Si nitride film, phosphorus acid solution or the like is used as liquid chemical for wet etching of mask layer 33. Subsequently, Si of central part RG1 is removed by wet etching using liquid chemical such as mixed acid with a patterned mask layer 33 as a mask. After that, photoresist 34 and mask layer 33 are removed. In addition, photoresist 34 may be removed before the wet etching of Si.

As mask layer 33, a Si oxide film and an oxide film or a nitride film other than the Si oxide film may be used.

Figure 18:
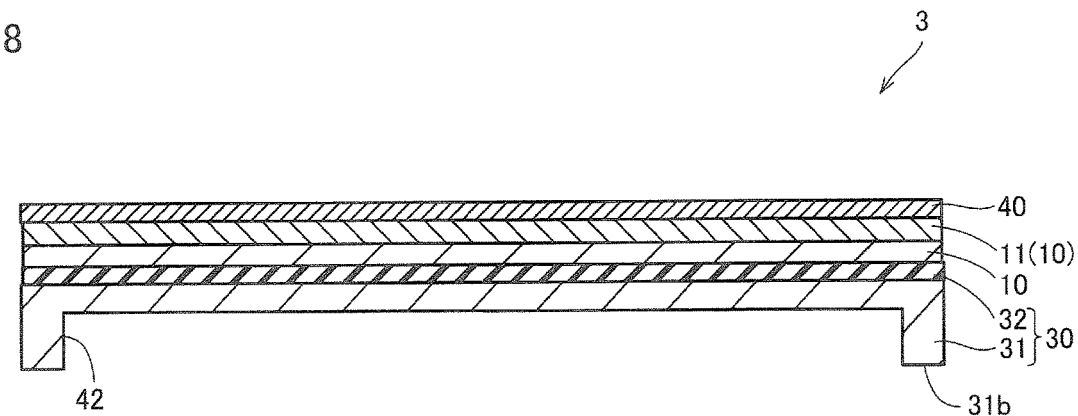
FIG. 18 is a cross-sectional view indicating the thirteenth step of the method for manufacturing of pellicle 1 in one embodiment of the present invention.

With reference to FIG. 18, as a result of the removal of Si in central part RG1, recessed part 42 is formed on reverse side 31b of Si substrate 31. In FIG. 18, recessed part 42 has a depth that does not penetrate Si substrate 31, and the bottom surface of recessed part 42 is made of Si. Due to the presence of recessed part 42, the thickness of the central part of Si substrate 31 (length in the vertical direction in FIG. 18) is thinner than the thickness of the peripheral part of Si substrate 31.

Figure 19:
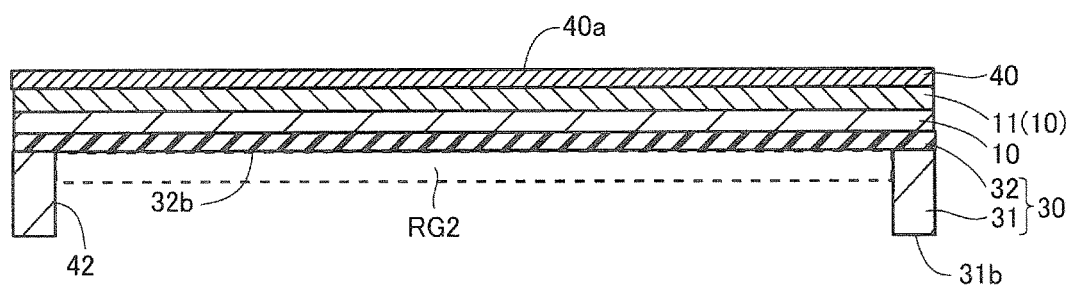
FIG. 19 is a cross-sectional view indicating the fourteenth step of the method for manufacturing of pellicle 1 in one embodiment of the present invention.

With reference to FIG. 19, the portion of Si substrate 31 present on the bottom surface RG2 of recessed part 42 is subsequently removed by wet etching. As a result, reverse side 32b of Si oxide film 32 is exposed on the bottom surface of recessed part 42. This wet etching is performed under the condition that the etching rate of Si is faster than the etching rate of Si oxide.

Figure 20:
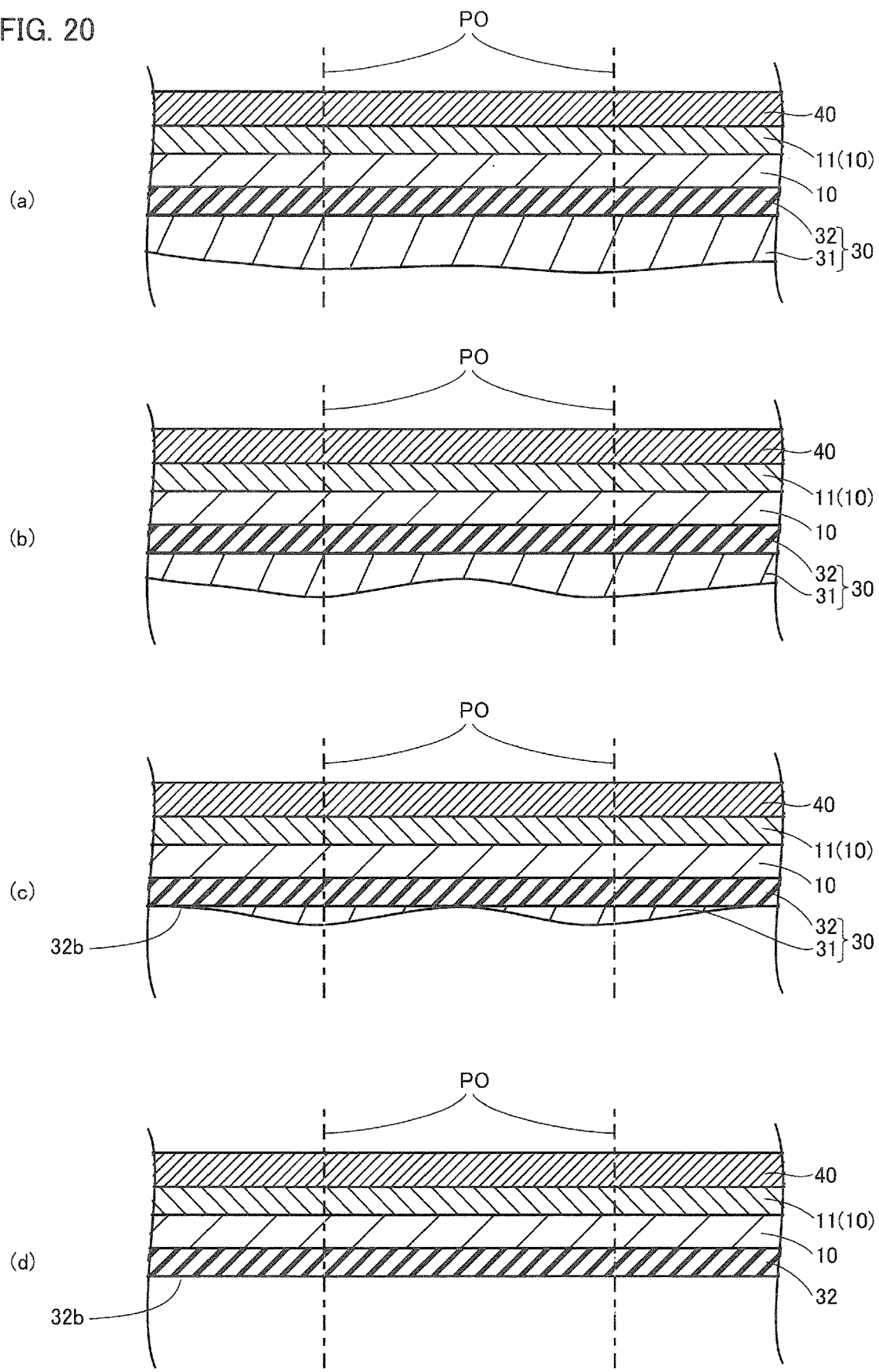
FIG. 20 is a partially enlarged cross-sectional view schematically showing a situation in which Si substrate 31 is wet etched in the step shown in FIG. 19.

FIG. 20 is a partially enlarged cross-sectional view schematically showing how Si substrate 31 is wet etched in the step shown in FIG. 19.

With reference to FIG. 20, there are variations in the etching rate of Si substrate 31 when viewed in a plane, due to the difference in the amount of liquid chemical adhering to Si substrate 31. In particular, if the etching rate of the position PO in the plane of Si substrate 31 is slower than the etching rate of other positions in the plane of Si substrate 31, the thickness of the position PO during etching is thicker than the other positions (See FIG. 20 (a)). As the etching of Si substrate 31 progresses (as the amount of Si substrate 31 removed increases), the thickness variation of Si substrate 31 becomes more pronounced (See FIG. 20 (b)).

If Si oxide film 32 is present, etching slows down when it reached reverse side 32b of Si oxide film 32. This is because the etching rate of Si is faster than the etching rate of Si oxide. As a result, etching at positions other than position PO is decelerated when it reaches reverse side 32b of Si oxide film 32. On the other hand, etching of the delayed position PO continues (FIG. 20 (c)). As a result, Si substrate 31 is uniformly removed (FIG. 20 (d)). In this way, the Si oxide film 32 acts as an etching stopper, and the adverse effects caused by the variation in the etching rate of the Si substrate 31 are mitigated by the Si oxide film 32.

Just as Si oxide film 32 acted as an etching stopper during wet etching of Si substrate 31, Si oxide film 22 acted as an etching stopper during wet etching of Si substrate 21 (FIG. 12).

Wet etching of Si on the bottom surface RG2 is preferably performed by moving Si substrate 31 relative to liquid chemical used for wet etching. Methods for moving Si substrate 31 includes rotating Si substrate 31 without changing the position of Si substrate 31, repositioning Si substrate 31 (In other words, moving Si substrate 31), rotating Si substrate 31 while changing the position of Si substrate 31 and so on. As liquid chemical used for wet etching of Si, for example, mixed acid containing hydrofluoric acid and nitric acid, potassium hydroxide (KOH) aqueous solution, or the like is used.

When alkaline solution such as potassium hydroxide aqueous solution is used as liquid chemical for wet etching of Si, even SiC film 40 may be etched through the low-density pinholes present in SiC film 40. In order to prevent the SiC film 40 from being etched and to improve the quality of the SiC film 40, it is preferable to use the above-mentioned mixed acid as the liquid chemical for wet etching of Si.

The direction in which Si substrate 31 is moved during wet etching of Si is arbitrary. However, to avoid damaging the SiC film 40 due to pressure from the liquid chemical while moving the Si substrate 31, as the first to third methods below, it is preferable to move the Si substrate 31 in the direction within the plane (plane PL in FIGS. 21 to 23) parallel to the surface 40a of the SiC film 40.

Figure 21:
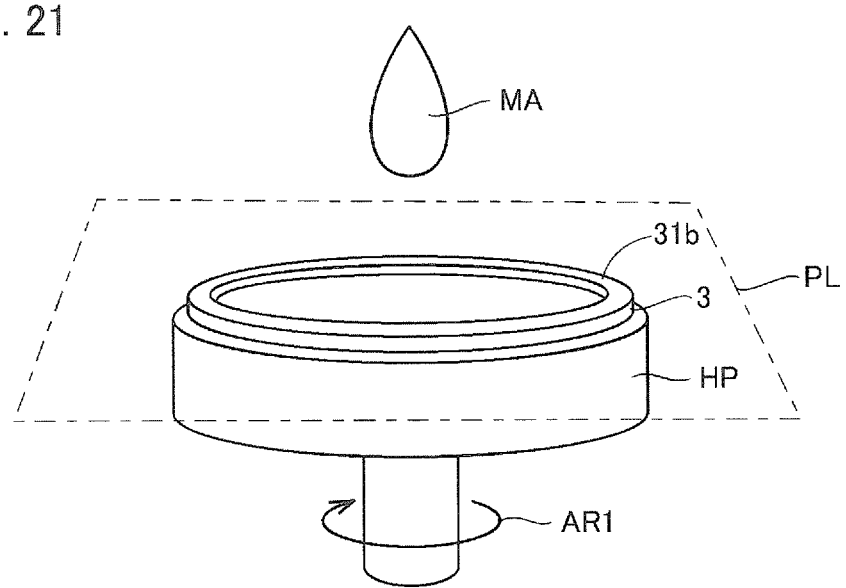
FIG. 21 is a diagram schematically showing a first method of wet etching of Si according to an embodiment of the present invention.
Figure 22:
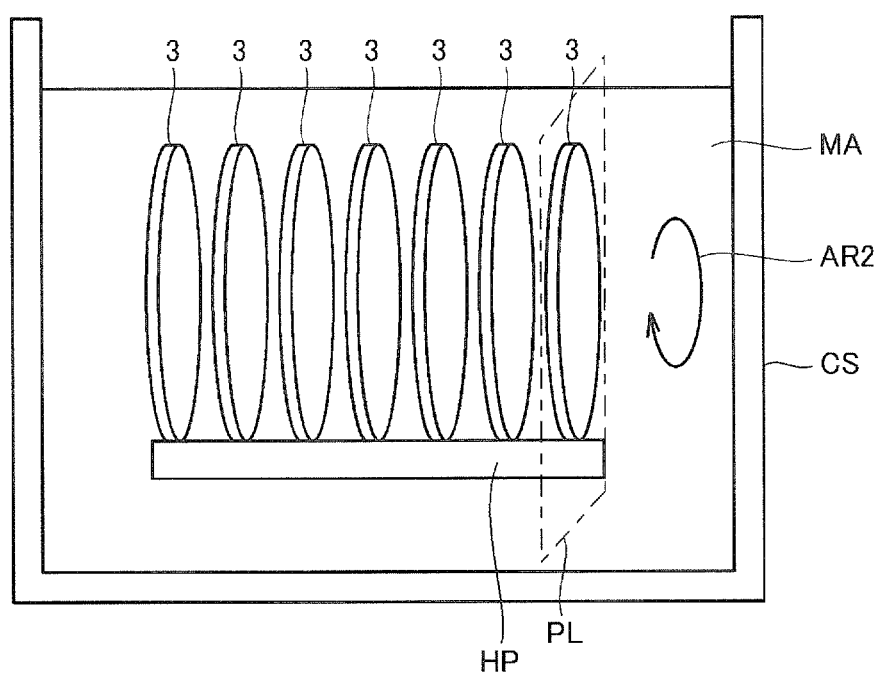
FIG. 22 is a diagram schematically showing a second method of wet etching of Si according to an embodiment of the present invention.
Figure 23:
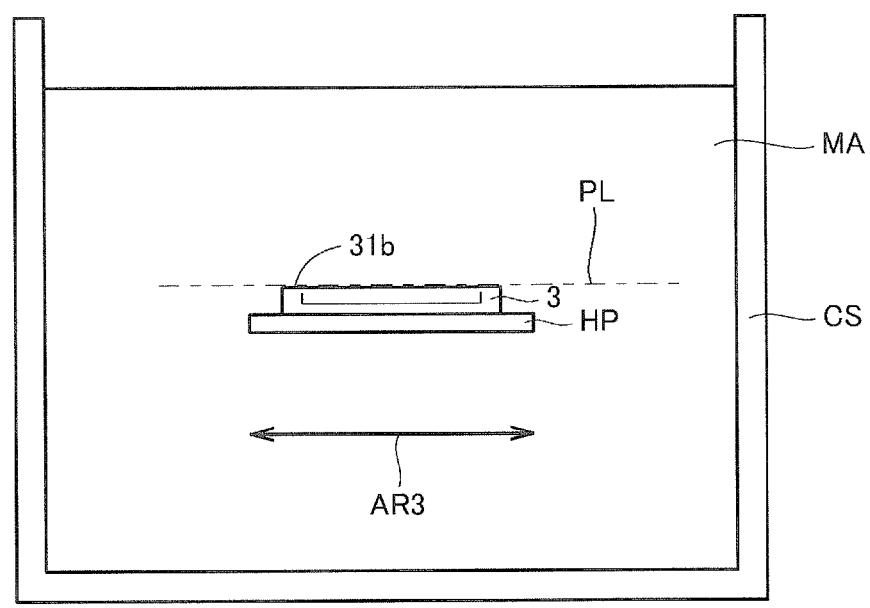
FIG. 23 is a diagram schematically showing a third method of wet etching of Si according to an embodiment of the present invention.

FIGS. 21 to 23 are diagrams schematically showing the first to third methods of wet etching of Si according to the embodiment of the present invention. According to the description of FIGS. 21 to 23, the structure immediately before the wet etching of Si is described as intermediary body 3.

With reference to FIG. 21, the first method is a method in which Si is removed by spin etching. In the first method, intermediary body 3 is fixed to holding platform HP so that reverse side 31b of Si substrate 31 faces up. Then, as shown by the arrow AR1, holding platform HP is rotated with the rotation axis extending in the direction orthogonal to reverse side 31b as a center. In this way, with the intermediary body 3 being rotated without changing the position of the intermediary body 3, the liquid chemical MA (etching liquid) used for wet etching is injected onto the reverse side 31b of the Si substrate 31. The rotation speed of holding platform HP is set to, for example, about 500 to 1500 rpm.

With reference to FIG. 22, in the second method, a plurality of intermediary bodies 3 are fixed to the holding platform HP in a standing state. Then, a plurality of intermediary bodies 3 are immersed in the liquid chemical MA filled inside the reaction vessel CS. Within the plane PL parallel to the surface 40a of the SiC film 40, the intermediary body 3 and holding platform HP are rotated while changing the position of the intermediary body 3 as indicated by the arrow AR2.

With reference to FIG. 23, in the third method, intermediary body 3 is fixed to holding platform HP so that reverse side 31b of Si substrate 31 faces up. Then, intermediary body 3 is immersed in liquid chemical MA filled inside reaction vessel CS. Within the plane PL parallel to the surface 40a of the SiC film 40, the intermediary body 3 and holding platform HP are reciprocated in a straight line as indicated by the arrow AR3.

Figure 24:
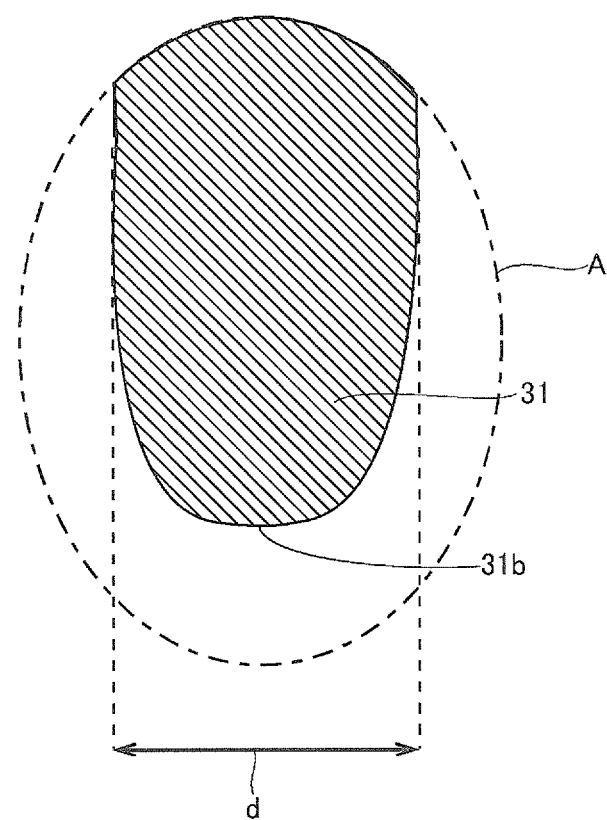
FIG. 24 is an enlarged view of part A in pellicle 1 shown in FIG. 1.

FIG. 24 is an enlarged view of part A in pellicle 1 shown in FIG. 1. In FIG. 24, the amount of change in the width of Si substrate 31 is emphasized more than the actual one.

With reference to FIG. 24, mixed acid including hydrofluoric acid and nitric acid has the effect of isotropically etching Si. For this reason, when mixed acid including hydrofluoric acid and nitric acid is used as liquid chemical for wet etching of Si, the width d (the horizontal length in FIG. 24) of Si substrate 31 decreases as it is away from SiC film 40 (with the direction from SiC film 40 to reverse side 31b of Si substrate 31), as a trace.

Figure 25:
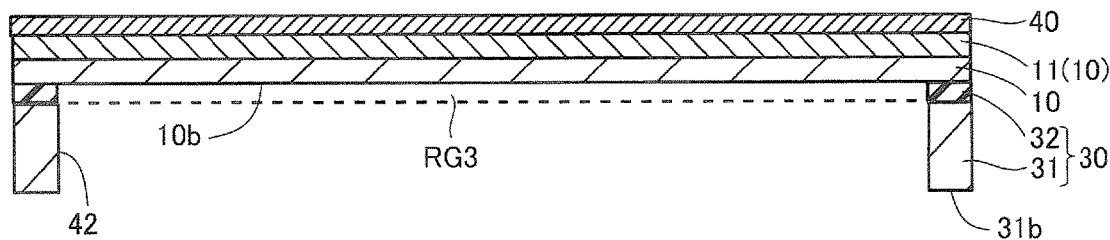
FIG. 25 is a cross-sectional view indicating the fifteenth step of the method for manufacturing of pellicle 1 in one embodiment of the present invention.

With reference to FIG. 25, after exposing the reverse side 32b of Si oxide film 32, the portion of Si oxide film 32 at the bottom RG3 of recessed part 42 is removed by wet etching. As a result, reverse side 10b of Si layer 10 is exposed on the bottom surface of recessed part 42. When wet etching of Si oxide film 32, liquid chemical such as HF is used.

Figure 26:
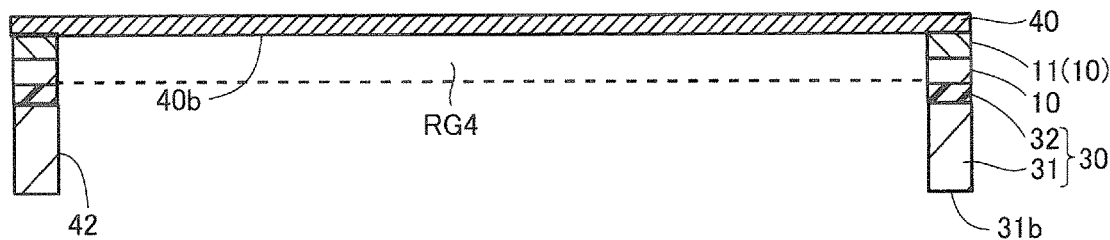
FIG. 26 is a cross-sectional view indicating the sixteenth step of the method for manufacturing of pellicle 1 in one embodiment of the present invention.

With reference to FIG. 26, after exposing the reverse side 10b of the Si layer 10, the portion of the Si layer 10 on the bottom surface RG4 of the recessed part 42 is removed by wet etching. As a result, reverse side 40b of SiC film 40 is exposed on the bottom surface of recessed part 42. By the above steps, pellicle 1 shown in FIG. 1 can be obtained.

Similar to the method described with reference to FIGS. 21 to 23, wet etching of Si layer 10 is preferably performed by moving Si layer 10 relative to liquid chemical used for wet etching of Si layer 10.

In addition, low COP portion 11 can be confirmed by the following method.

As for pellicle 1 or pellicle intermediary body 2, by grinding SiC film 40, a sample with exposed surface 10a of Si layer 10 is prepared. Next, using COP detector 80, the COP of surface 10a of Si layer 10 in the sample is detected, and the number of COPs is measured.

Figure 27:
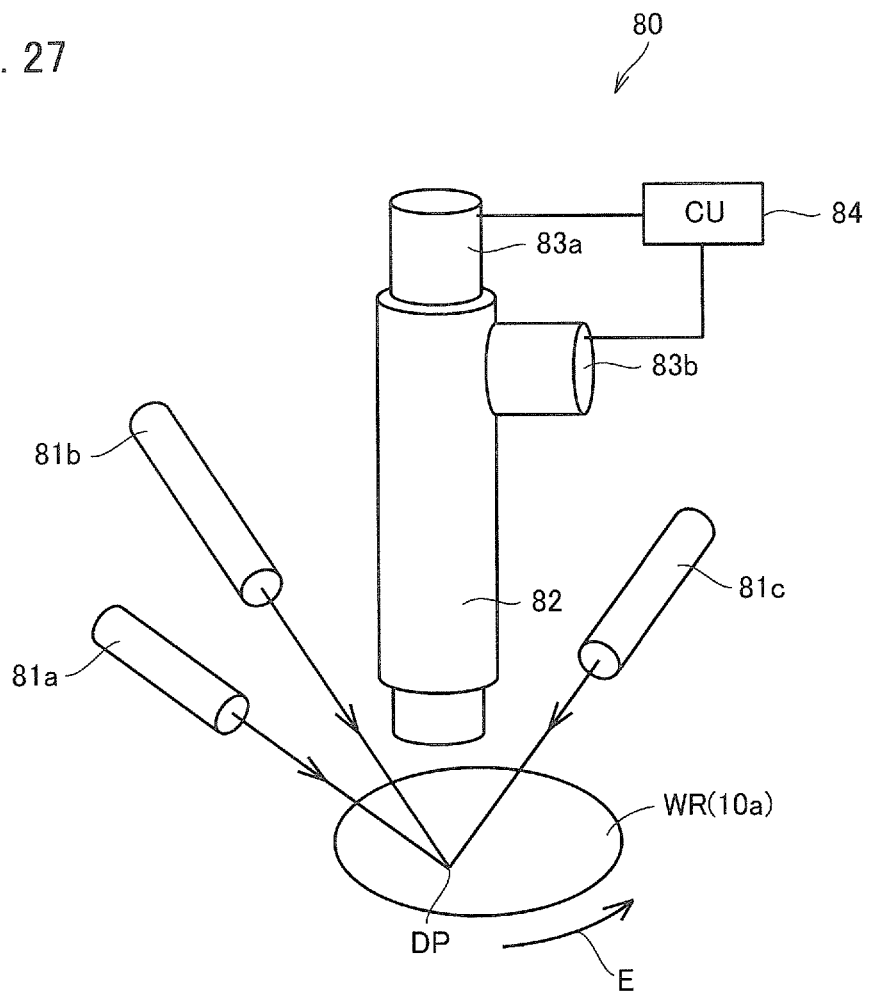
FIG. 27 is a diagram illustrating a method of detecting COP by COP detector 80 according to an embodiment of the present invention.

FIG. 27 is a diagram illustrating a method of detecting COP by COP detector 80 in one embodiment of the present invention.

With reference to FIG. 27, COP detector 80 includes laser light irradiation parts 81a, 81b, and 81c, beam splitter 82, light receiving sections 83a and 83b, and control unit 84. From different angles and directions, each of the laser light irradiation parts 81a, 81b, and 81c irradiates a laser beam towards given detection position DP on the surface of the sample WR (surface 10a of Si layer 10). As an example of laser light irradiation conditions, the wavelength of the emitted laser light is 405 nanometers, and the output is 60 mW.

Beam splitter 82 separates the laser light scattered by the predetermined detection position DP into scattered light of the laser light incident on detection position DP at a high angle of incidence and the scattered light of the laser light incident on detection position DP at a low angle of incidence.

The light receiving section 83a receives scattered light of the laser light incident on detection position DP at a high angle of incidence from the scattered light separated by the beam splitter 82, and outputs a signal according to the light receiving intensity. The light receiving section 83b receives the scattered light of the laser light incident on detection position DP at a low angle of incidence from the scattered light separated by the beam splitter 82, and outputs a signal according to the light receiving intensity.

Control unit 84 consists of a PC (Personal Computer). control unit 84 determines the unevenness of detection position DP and detects COP by comparing the intensities of the signals output from each of light receiving sections 83a and 83b. As an example, the minimum size (width) of COP that can be detected by COP detector 80 is 0.1 micrometers.

If the sample WR has a disc shape, COP detector 80 detects the COPs of the entire surface of sample WR and measures the total number of COPs (the number of COPs) of the surface of sample WR, by rotating sample WR in the direction indicated by arrow E and changing detection position DP from the center of sample WR to the peripheral part.

After that, during the thickness of Si layer 10 is gradually reduced by etching Si layer 10, the detection of COPs over the entire surface of the sample using COP detector 80 is repeated. This makes it possible to obtain the distribution of the number of COPs in the thickness direction of Si layer 10 in the sample.

According to this embodiment, the quality of the pellicle film can be improved, since SiC film 40 which is a pellicle film can be formed by using the part with less defect (low COP portion 11) in Si layer 10 as a foundation. Also, since Si oxide film 32 functions as an etching stopper when etching Si substrate 31, the adverse effect caused by the variation in the etching rate of Si substrate 31 can be alleviated, and the occurrence of cracks into the pellicle film can be suppressed. As a result, the production yield of pellicle films can be improved.

Figure 28:
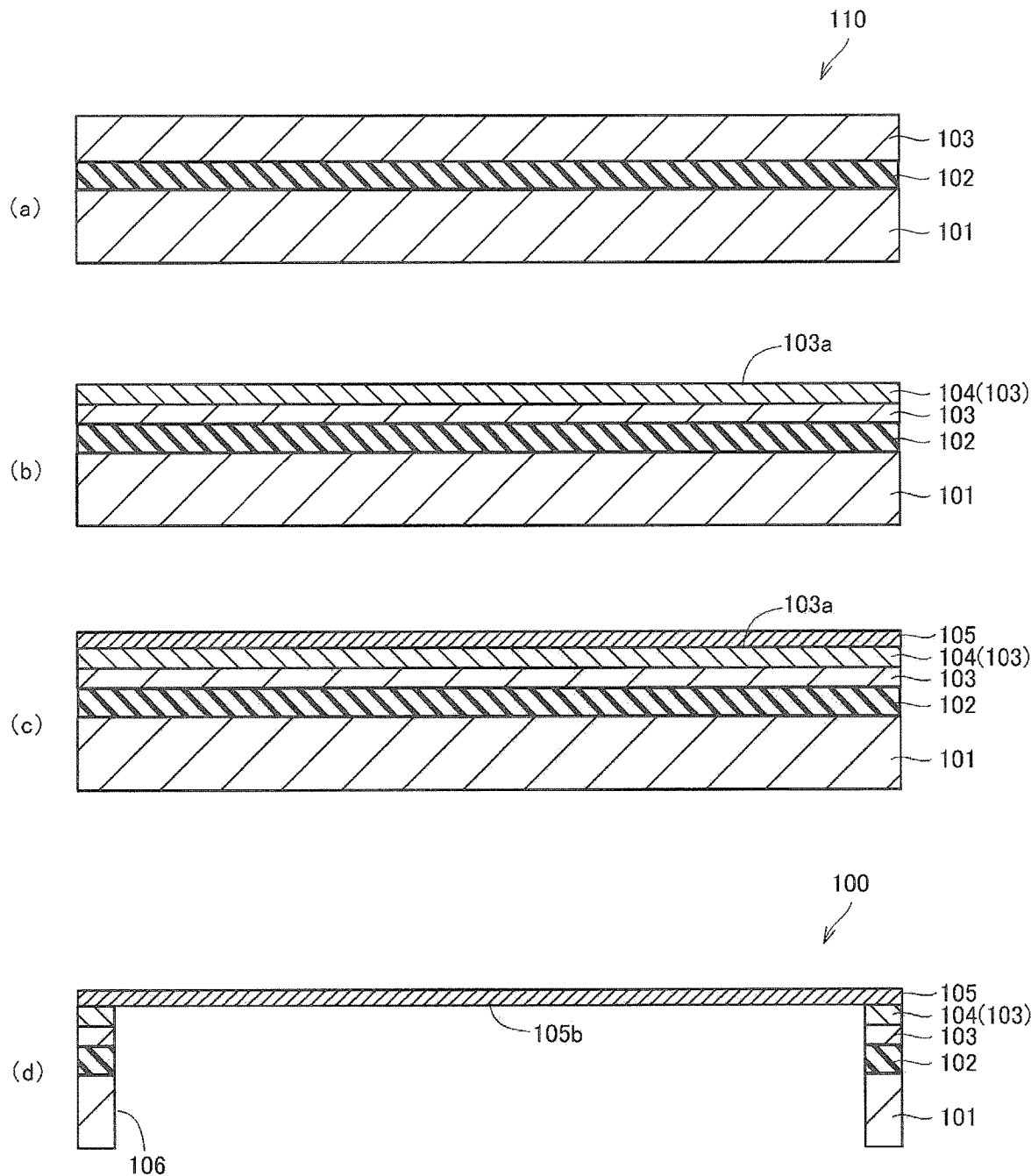
FIG. 28 is a diagram showing a method for manufacturing of pellicle 100 in a reference example.

FIG. 28 is a diagram showing a method for manufacturing of pellicle 100 in a reference example.

With reference to FIG. 28, the following method for manufacturing can also be considered as a method for manufacturing that can form a SiC film by using a Si oxide film as an etching stopper and a low COP portion as a foundation. SOI substrate 110 containing Si substrate 101, Si oxide film 102 formed on Si substrate 101, and Si layer 103 formed on Si oxide film 102 is prepared (FIG. 28(a)). Next, by annealing SOI substrate 110 in a low oxygen atmosphere, low COP portion 104 is formed on surface 103a of Si layer 103 (FIG. 28(b)). Subsequently, SiC film 105 is formed on surface 103a of Si layer 103 (FIG. 28(c)). Then, by etching the central part of Si substrate 101, Si oxide film 102, and Si layer 103, recessed part 106 is formed, and reverse side 105b of SiC film 105 is exposed at the bottom of recessed part 106 (FIG. 28 (d)).

However, if this method for manufacturing is used, the Si oxide in the Si oxide film 102 is released as gas in the atmosphere during the annealing of the SOI substrate 110 for the forming of the low COP portion 104 (FIG. 28 (b)). As a result, it becomes difficult to maintain a low oxygen atmosphere and it becomes difficult to form low COP portion 104.

According to the method for manufacturing of the present embodiment, it is possible to form the SiC film 40 with the low COP portion 11 as the foundation while alleviating the adverse effect caused by the variation in the etching rate of the Si substrate 31. As a result, it is possible to improve the quality of pellicle films while improving the production yield of pellicle films.

[Others]

The order of implementation of each steps in the methods for manufacturing of the above-described embodiments can be changed as appropriate.

The embodiments described above should be considered exemplary in all respects and not restrictive. The scope of the present invention is indicated by the scope of claims rather than the above description and is intended to include the claims and all changes within the meaning and scope of the equivalent.

[Explanation of Symbols]
1, 100 pellicle (an example of a pellicle)
2 pellicle intermediary body (an example of a pellicle intermediary body)
3 intermediary body
10, 103 Si substrate or Si layer (an example of a Si layer)
10a, 103a surface of Si layer
10b reverse side of Si layer
11, 104 low COP portion (an example of a low COP portion)
12 Si substrate before annealing
12a surface of Si substrate before annealing
20, 30 oxide film substrate (an example of first and second oxide film substrates)
21, 31, 101 Si substrate (an example of Si substrate, first Si substrate, and second Si substrate)
21a, 31a surface of Si substrate
21b, 31b reverse side of Si substrate
21c, 31c side surface of Si substrate
22, 32, 102 Si oxide film (an example of Si oxide film, first Si oxide film, and second Si oxide film)
22a, 32a surface of Si oxide film
32b reverse side of Si oxide film
33 mask layer
34 photoresist
40, 105 SiC film (an example of SiC film)
40a surface of SiC film
40b, 105b reverse side of SiC film
41 supporting substrate
41a surface of supporting substrate
41b reverse side of supporting substrate
41c side surface of supporting substrate
42, 106 recessed part (an example of a recessed part)
80 COP (Crystal Originated Particle) detection device
81a, 81b, 81c laser light irradiation part
82 beam splitter
83a, 83b light receiving section
84 control unit
110 SOI (Silicon On Insulator) substrate
CS reaction vessel
DP detection position
HP holding platform
MA liquid chemical
PL plane
PO position of Si substrate in plane
RG1 central part of reverse side of Si substrate
RG2, RG3, RG4 bottom of recessed part
WR sample

What is claimed is:

1. A pellicle intermediary body comprising:
a Si substrate,
a Si oxide film formed on a surface of the Si substrate, and
a Si layer formed on a surface of the Si oxide film, wherein
the Si layer includes a low COP (Crystal Originated Particle) portion which is a part where the number of COPs decreases as it approaches the surface of the Si layer and is formed in a part constituting the surface of the Si layer.

2. A pellicle comprising:
a Si substrate with a ring-like planar shape,
a Si oxide film which has a ring-like planar shape, formed on a surface of the Si substrate,
a Si layer which has a ring-like planar shape, formed on a surface of the Si oxide film, and
a SiC film formed on a surface of the Si layer, wherein the Si layer includes a low COP (Crystal Originated Particle) portion which is a part where the number of COPs decreases as it approaches the surface of the Si layer and is formed in a part constituting the surface of the Si layer.

3. A method for manufacturing a pellicle intermediary body comprising steps of:
preparing a Si layer which includes a low COP (Crystal Originated Particle) portion which is a part where the number of COPs decreases as it approaches a surface and is formed in a part constituting the surface,
preparing a first oxide film substrate including a first Si substrate, and a first Si oxide film formed on a surface of the first Si substrate,
preparing a second oxide film substrate including a second Si substrate, a second Si oxide film formed on a surface of the second Si substrate,
joining the first Si oxide film to the surface of the Si layer,
removing a part that constitutes a reverse side of the Si layer after joining the first Si oxide film,
joining the second Si oxide film to the reverse side of the Si layer after the part constituting the reverse side of the Si layer is removed,
exposing the first Si oxide film by wet etching the first Si substrate under a condition that an etching rate of Si is faster than an etching rate of Si oxide after joining the second Si oxide film, and
exposing the surface of the Si layer by removing the first Si oxide film after exposing the first Si oxide film.

4. The method for manufacturing a pellicle intermediary body according to claim 3, wherein
the first oxide film substrate containing the first Si substrate and the first Si oxide film formed on the surface and the reverse side of the first Si substrate is prepared, in the step in which the first oxide film substrate is prepared, and the method further comprises a step of
exposing the reverse side of the first Si substrate by removing a portion formed on the reverse side of the first Si substrate in the first Si oxide film, after joining the first Si oxide film.

5. The method for manufacturing a pellicle intermediary body according to claim 3, wherein
the second oxide film substrate containing the second Si substrate and the second Si oxide film formed on the surface and the reverse side of the second Si substrate is prepared, in the step in which the second oxide film substrate is prepared, and the method further comprises a step of
exposing the reverse side of the second Si substrate by removing a portion formed on the reverse side of the second Si substrate in the second Si oxide film, after joining the second Si oxide film.

6. A method for manufacturing a pellicle comprising steps of:
producing a pellicle intermediary body using the method according to claim 3,
forming a SiC film on a surface of the Si layer,
forming a recessed part on the second Si substrate and exposing the second Si oxide film on a bottom of the recessed part, by wet etching the second Si substrate under a condition that an etching rate of Si is faster than an etching rate of Si oxide, and
exposing the SiC film on the bottom of the recessed part by wet etching the second Si oxide film and the Si layer that are present at the bottom of the recessed part.

7. The method for manufacturing a pellicle according to claim 6, further comprising a step of:

forming the recessed part on the second Si substrate by mechanically grinding the second Si substrate, after the step that manufactures the pellicle film intermediary body and before the step that exposes the second Si oxide film, wherein the second Si oxide film is exposed at the bottom of the recessed part by wet etching the second Si substrate existing at the bottom of the recessed part at the step that exposes the second Si oxide film.

8. The method for manufacturing a pellicle according to claim 6, wherein the step that exposes the SiC film at the bottom of the recessed part includes a step that exposes the Si layer at the bottom of the recessed part by wet etching the second Si oxide film existing at the bottom of the recessed part, and a step that exposes the SiC film at the bottom of the recessed part by wet etching the Si layer existing at the bottom of the recessed part, wherein the Si layer is moved relative to liquid chemical used for wet etching of the Si layer at the step that exposes the SiC film.

\* \* \* \* \*